United States Patent [19]

Basol et al.

[11] Patent Number: 4,647,711

[45] Date of Patent: Mar. 3, 1987

[54] STABLE FRONT CONTACT CURRENT COLLECTOR FOR PHOTOVOLTAIC DEVICES AND METHOD OF MAKING SAME

[75] Inventors: Bulent M. Basol, Los Angeles, Calif.; William J. Biter, Hudson, Ohio

[73] Assignee: The Standard Oil Company, Cleveland, Ohio

[21] Appl. No.: 696,148

[22] Filed: Jan. 29, 1985

[51] Int. Cl.$^4$ ............... H01L 31/06; H01L 31/18
[52] U.S. Cl. .................... 136/256; 136/260; 29/572; 29/591; 357/30; 357/65; 357/68; 427/74; 427/76; 427/88
[58] Field of Search .......... 136/256, 260, 264, 265; 29/572, 580, 583, 591; 427/74–76, 88; 357/30, 65, 68, 71

[56] References Cited

U.S. PATENT DOCUMENTS 4,082,569 4/1978 Evans, Jr. ........................... 136/255
4,084,985 4/1978 Evans, Jr. ........................... 136/206

FOREIGN PATENT DOCUMENTS 58-56480 4/1983 Japan ............................... 136/256
60-50975 3/1985 Japan ............................... 136/256

Primary Examiner—Aaron Weisstuch
Attorney, Agent, or Firm—Jeffrey A. Wyand; Joseph G. Curatolo; Larry W. Evans

[57] ABSTRACT

A large area, thin-film photovoltaic device 30 having a transparent front contact 32 is made more efficient by the use of a current collector grid 36. The current collector grid 36 is embedded in an optically transparent electrically conductive layer 34 and may extend partially into a substrate 32 or partially into a first semiconductor layer 38. The process for preparing such thin-film photovoltaic devices includes forming channels in the optically transparent electrically conductive layer 34 and depositing the current collector grid material in the channels. By this design, problems encountered in the deposition of thin-film semiconductor layers due to the presence of relatively large current collector grids are effectively eliminated.

14 Claims, 5 Drawing Figures

STABLE FRONT CONTACT CURRENT COLLECTOR FOR PHOTOVOLTAIC DEVICES AND METHOD OF MAKING SAME

FIELD OF THE INVENTION

This invention relates to a front contact current collector grid for a photovoltaic device and a method of making such a grid. More specifically, the invention relates to a stable front contact current collector grid for a thin-film photovoltaic device and a method of making such a grid prior to the formation of the active semiconductor layers.

BACKGROUND OF THE INVENTION

Photovoltaic devices utilize specific conductivity characteristics of materials generally referred to as semiconductors, whereby solar energy or radiation is converted to useful electrical energy. This conversion results from the absorption of photon energy in the active region of the cell, whereby some of the absorbed energy causes the generation of electron-hole pairs. The energy required for the generation of electron-hole pairs in a semiconductor material is referred to as the band gap energy and generally is the minimum energy required to excite an electron from the valence band to the conduction band.

There are two principal measures of the utility of photovoltaic devices. First is the efficiency of the device, which is an ascertainable percentage of the total photon energy converted to useful electrical energy. High efficiency photovoltaic devices made of crystalline materials maximize efficiency by minimizing internal lattice defects. The second measure of the utility of a photovoltaic device is its cost. Single crystal devices are complex and costly to produce, and do not readily lend themselves to high volume production.

One approach to reducing the cost of photovoltaic devices is to utilize polycrystalline thin film materials and a heterojunction. A heterojunction refers to the active junction formed at the interface between two dissimilar materials, such as cadmium sulfide and cadmium telluride, as taught by Basol, et al. in U.S. Pat. No. 4,388,483. Basol, et al. describe thin-film heterojunction photovoltaic cells wherein the active layer comprises at least one of the metal elements of Class IIB of the Periodic Table of Elements and one of the non-metal elements of Class VIA of the Periodic Table of Elements. One feature of such photovoltaic devices is the use of extremely thin-film type active layers. As an example, Basol, et al. utilized a cadmium sulfide layer on the order of 0.02-0.05 micrometer and a cadmium telluride layer on the order of about 1.3 micrometers. While such economy of material has obvious advantages, it has also presented an unexpected concern with respect to current collection.

Such thin-film photovoltaic devices typically comprise an optically transparent substrate through which radiant energy enters the device, a first semiconductor layer formed on the transparent substrate, a second semiconductor layer of different conductivity type than the first semiconductor layer and forming a junction with the first layer, and a conductive film back contact. When the substrate is not electrically conductive, a transparent electrically conductive film is disposed between the substrate and the first semiconductor layer to function as a front contact current collector; this front contact generally being a layer of a transparent conductive oxide. Transparent conductive oxides, such as indium tin oxide, indium oxide, zinc oxide, and tin oxide are not efficient current collectors in cells of any appreciable size, that is greater than about one square centimeter, due to their inherent resistivity, which is on the order of about 10 ohms per square at thicknesses necessary for good optical transmission. The transparent conductive layer must be supplemented with more efficient current collection means such as a front contact current collector grid. This grid comprises a network of very low resistivity material that collects electrical current from the transparent conductive layer and efficiently channels the current to a central current collector.

Front contact current collector grids are generally made of materials such as copper, gold, and silver. Since the grid material is not optically transparent, the presence of the grid will lower the overall efficiency of the photovoltaic device. To minimize this disadvantage, current collector grids are designed to cover as little active surface area as possible. One way in which this is done is by forming extremely thin grid lines in relation to the active surface area of the photovoltaic device. When the grid comprises such narrow strips, then the height of each grid line may be calculated, based on the grid material, as a function of resistivity. To obtain a desired low resistivity, the height of the gridline is often found to exceed the thickness of the first active semiconductor layer and to extend into the second active semiconductor layer. This geometry creates problems with respect to shorting of the device and to uniform formation of the semiconductor layers themselves.

Generally, a front contact current collector grid is deposited onto a transparent, conductive layer and followed by subsequent depositions of the active semiconductor layers. This procedure has several drawbacks when applied to the formation of a front contact current collector grid for a photovoltaic device when the thickness of the grid exceeds the thickness of the first semiconductor layer.

A first concern relates to diffusion of the grid material into the semiconductor layers. If subsequent process steps for the formation of the semiconductor layers include treatments at elevated temperatures that encourage diffusion, or if the semiconductor layers are electrodeposited in a bath that may dissolve the grid material, then both the grid and the semiconductor layers may be adversely affected. In the latter instance, the grid may be deteriorated and the bath may become contaminated with leached grid material, which then appears in the deposited semiconductor layer.

A second concern arises with regard to the deposition of semiconductor layers subsequent to the formation of the current collector grid. The deposition may not be uniform or complete due to the presence of the current collector grid, which has a relatively large thickness. It has been seen that the electrodeposition of semiconductor materials near such a grid is imperfect, often leaving exposed portions of the transparent conductive layer which may become eroded. Under such circumstances, the grid is separated from the semiconductor layers by a large resistance or is completely electrically insulated from the semiconductor layers and cannot be an effective current collector. This has the adverse result of increasing the series resistance of the photovoltaic device, and may ultimately cause failure of such a device.

In addition, front contact current collector grids in thin-film photovoltaic devices where the grid thickness exceeds the combined thicknesses of the semiconductor layers must generally be covered with an insulating material to prevent short circuiting between the current collector grid and a back electrical contact. Such an insulation layer is costly and time-consuming to incorporate into a device.

What is needed in the area of efficient current collection in photovoltaic devices is a front contact current collector grid that does not give rise to the above-described deficiencies nor necessarily require the use of an insulation layer.

It is therefore one object of the present invention to provide a front contact current collector grid for photovoltaic devices, which current collector grid is not accompanied by the above-identified shortcomings.

It is another object of the present invention to provide a photovoltaic device having a stable, front contact current collector grid incorporated therein.

It is still another object of the invention to provide a photovoltaic device that does not require an insulation layer disposed between the front contact current collector grid and the back electrical contact.

It is yet another object of the present invention to provide a method for the formation of a photovoltaic device that has a stable, front contact current collector grid incorporated therein.

These and additional objects of the present invention will become apparent to one skilled in the art from the below description of the invention and the appended claims.

SUMMARY OF THE INVENTION

The present invention relates to a front contact current collector grid for a photovoltaic device comprising an optically transparent substrate through which radiant energy enters the photovoltaic device; an optically transparent electrically conductive material deposited thereon; a first semiconductor layer of one conductivity type; a second semiconductor layer having a conductivity type different from the conductivity of the first semiconductor layer and forming a junction therewith; and a back electrical contact in contact with the second semiconductor layer; the front contact current collector grid being disposed in channels in the optically transparent electrically conductive material.

The invention further relates to a photovoltaic device comprising an optically transparent substrate through which radiant energy enters the device, a layer of an optically transparent electrically conductive material deposited onto the substrate, a front contact current collector grid embedded in the optically transparent electrically conductive layer, a first semiconductor layer deposited onto the optically transparent electrically conductive layer, a second semiconductor layer contiguous to the first semiconductor layer and forming a junction therewith and an electrically conductive film disposed on the second semiconductor layer to form an electrical contact therewith.

The present invention also relates to a process for forming a photovoltaic device, which process comprises:

(a) depositing a layer of an optically transparent electrically conductive material onto an optically transparent substrate;
(b) forming channels in the optically transparent electrically conductive layer;
(c) depositing electrically conductive material into the channels to form a front contact current collector grid;
(d) depositing a first semiconductor layer onto the transparent conductive layer;
(e) depositing a second semiconductor layer onto the first semiconductor layer; and
(f) depositing an electrically conductive film onto the second semiconductor layer to provide an electrical contact therewith.

In the process of the present invention the channels formed in the optically transparent electrically conductive layer may also extend into the optically transparent substrate.

DETAILED DESCRIPTION OF THE INVENTION

As used herein, reference is made to large-area, thin-film photovoltaic devices. Such photovoltaic devices are characterized in having an exposed active surface area of at least one square centimeter, combined semiconductor layer thicknesses of less than about two micrometers, and comprising semiconductor layers of differing conductivity types. Examples of combinations of such semiconductor layers include CdTe/CdS, HgCdTe/CdS, $Cu_2S$/CdS, $CuInSe_2$/CdS, CdZnTe/CdS, and ZnTe/CdS. Preferably, the semiconductor layer combinations include individual layers wherein each layer comprises at least one of the metal elements of Group IIB of the Periodic Table of Elements and one of the non-metal elements of Group VIA of the Periodic Table of Elements, such as CdS, CdTe, and HgCdTe.

The front contact current collector grid consists of at least one layer of an electrically conductive material such as copper, gold, silver, nickel, and, as described in U.S. Pat. No. 4,595,790, may also be aluminum, indium, cadmium, tin, lead, zinc, and mixtures and alloys thereof, as well as mixtures and alloys of any of the above. Preferably a front contact current collector grid of this invention comprises at least one layer of an element selected from the group consisting of copper, gold, silver, nickel, aluminum, and mixtures and alloys thereof. Most preferably the current collector grid of this invention is a bilayer copper/nickel grid.

While the invention will be described below as utilizing cadmium sulfide and cadmium telluride semiconductor layers, such embodiment is not to be regarded as limitative. The invention can be utilized in any semiconductor photovoltaic device wherein a current collector grid is incorporated as a front contact and has special applicability in a photovoltaic device wherein the thickness of the grid exceeds the thickness of the first semiconductor layer.

U.S. Pat. No. 4,388,483 to Basol, et al., incorporated herein by reference, teaches a thin-film photovoltaic device having an n-type semiconductor layer of cadmium sulfide and a p-type semiconductor layer of cadmium telluride. Light enters such a cell through a transparent substrate and passes therethrough into a cadmium sulfide layer, then into a cadmium telluride layer. Since the cadmium sulfide layer attenuates light reaching the cadmium sulfide/cadmium telluride heterojunction, it is desirable to provide a very thin cadmium sulfide layer, in the range of from about 0.01 micrometer to about 0.1 micrometer in thickness. The cadmium telluride layer is an efficient absorber of light and does not require a thickness of more than about 1.2 micrometers to effectively utilize about all of the usable solar spectra which enters.

The cadmium sulfide layer is contiguous to a layer of an optically transparent electrically conductive material such as indium tin oxide that is disposed between the cadmium sulfide layer and the transparent substrate. To enhance the current collection of the optically transparent electrically conductive layer, a current collector grid is utilized. This front contact current collector grid may have any geometry that allows efficient current collection. Preferably the grid comprises narrow strips so as to permit the maximum amount of solar radiation to enter the cell. Because the grid is narrow, each strip has a relatively large thickness so that the grid achieves a low resistivity compared to the transparent conductive layer. The typical thickness of such a grid is generally from about 0.5 micrometers to about 10 micrometers, depending on the material used for the grid and the width of the grid.

However, as has been described above in the Background of the Invention, the formation of a front contact current collector grid on a transparent conductive material followed by subsequent deposition of active semiconductor layers has certain inherent disadvantages: incomplete deposition of semiconductor layers due to the current collector grid geometry, diffusion of current collector grid material into semiconductor material, and exposure of the transparent conductive layer to subsequent process steps which in electrodeposition processing may erode this layer. All of these disadvantages can prevent the photovoltaic device from performing efficiently, if at all.

In accordance with the present invention, the above-described concerns are eliminated by embedding the front contact current collector grid in the optically transparent electrically conductive layer, such that substantially all of the grid is disposed in the transparent conductive layer. The concept of the present invention may be realized by utilizing a transparent conductive layer that is about as thick, or thicker than the intended height of the current collector grid. Alternatively, a portion of the current collector grid may extend into the transparent substrate, or a portion of the current collector grid may extend above the transparent conductive layer, but preferably not to an extent that exceeds the thickness of the first semiconductor layer. In this way, the transparent conductive layer is completely covered with the first semiconductor layer that withstands subsequent processing steps and which protects the transparent conductive layer from acidic deposition baths and etching solutions.

The present invention also provides a photovoltaic device and method of making, which method includes depositing a layer of an optically transparent electrically conductive material onto a transparent substrate. The transparent conductive layer may be formed by any known process, such as vapor deposition, electrodeposition, and the like. The thickness of the transparent conductive layer generally ranges from about 0.05 micrometer to about 2 micrometers, and may be specifically chosen to take into account the thickness of the front contact current collector grid.

Channels are then formed in the transparent conductive layer in a pattern that anticipates the desired grid pattern. The channels may be formed by etching such as chemical and electrochemical etching, by scribing such as mechanical and laser scribing, by abrasion, or by other means obvious to one skilled in the art.

If desired, the channels may also be etched, scribed, or otherwise formed to also extend into the transparent substrate. This may be desirable when a current collector grid of significant thickness, relative to the individual layers of the photovoltaic devices, is utilized.

Once formed, an electrically conductive material is deposited into the channels to form the front contact current collector grid. The deposition of material to form the grid may also extend the grid above the transparent conductive layer. Preferably, the grid does not extend above the transparent conductive layer to a height greater than the thickness of the first semiconductor layer. In this way, it is assured that the transparent conductive layer and the current collector grid material will be fully covered by the first semiconductor layer and will not be exposed to subsequent processing conditions that may be detrimental to the integrity of the transparent conductive layer and/or prevent leaching of grid material into the subsequently deposited semiconductor layers. Also, when the current collector grid does not extend higher than the first semiconductor layer, then the first semiconductor layer and subsequently formed layers can be uniformly deposited over and around the grid.

Should the current collector grid extend upward from the transparent conductive layer to be in close proximity to the back electrical contact, or should the current collector grid comprise a material that may diffuse across the active semiconductor layers and cause a short circuit between the grid and the back electrical contact, then it is necessary to dispose an electrically insulating layer between the grid and the back electrical contact to prevent short circuiting therebetween.

The following drawings and examples demonstrate the effectiveness of the subject invention. It is to be understood that these drawings and examples are utilized for illustrative purposes only, and are not intended in any way, to be limitative of the present invention.

DETAILED DESCRIPTION OF THE DRAWINGS

Figure 1:
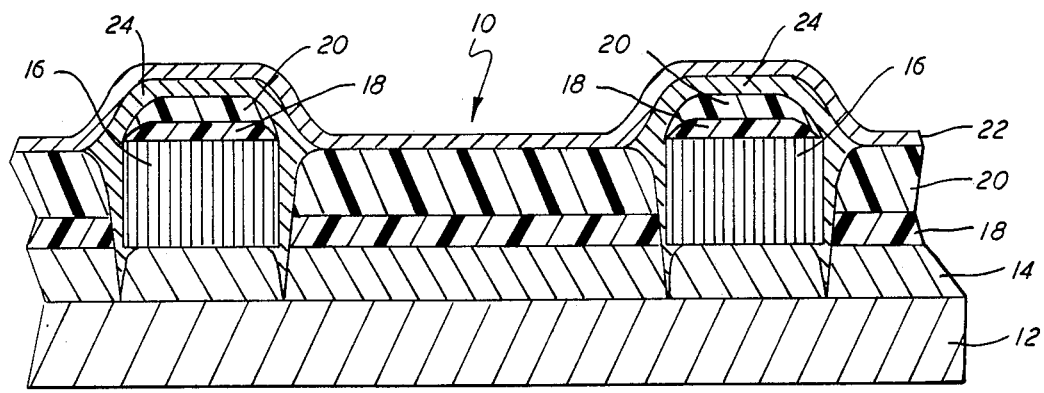
FIG. 1 is a cross-sectional view of a photovoltaic device suffering from the disadvantages of known electrodeposition processes when a front contact current collector grid is incorporated therein.

As shown in FIG. 1, a photovoltaic device in accordance with known art and which utilizes a front contact current collector grid incorporated therein, shown generally by reference 10, comprises a transparent substrate 12, such as glass, through which light may enter the device. A layer of an optically transparent electrically conductive material 14 is deposited onto the substrate 12 and is contiguous thereto. A front contact current collector grid 16 is shown in touching contact with the transparent conductive layer 14. In accordance with known electrodeposition art, a first semiconductor layer 18 is disposed on the transparent conductive layer 14 and the current collector 16 and a second semiconductor layer 20 is disposed on the first semiconductor layer 18. The conductivity types of semiconductor layers 18 and 20 are not the same. As an example, the first semiconductor layer 18 may be an n-type semiconductor layer of cadmium sulfide and the second semiconductor layer 20 may be a p-type semiconductor layer of cadmium telluride. The thickness of the current collector grid 16 is shown to exceed the thickness of the first semiconductor layer 18. An insulating layer 24 is then disposed over the current collector grid 16. A back contact current collector 22 is deposited in touching contact with the second semiconductor layer 20. The insulating layer 24 maintains the grid 16 in electrical isolation from the back contact 22.

It is to be noted herein, and appreciated by those skilled in the art, that the dimensions of the various features of the figures depicted herein are not drawn to scale with respect to each individual feature. A typical thin-film photovoltaic device may contain active semiconductor layers having combined thicknesses in the range of from about 1 micrometer to about 10 micrometers, and utilize a front contact current collector grid having a thickness of from about 1 micrometer to about 10 micrometers. It is appreciated that the features in the drawings are depicted for the purpose of clarifying the subject invention.

FIG. 1 depicts a photovoltaic device wherein the transparent conductive layer 14 is eroded near the edges of the current collector grid strips 16. This erosion may have been caused by incomplete deposition of the semiconductor layers 18 and 20 or by other irregularities along the edges of the current collector gridlines. Subsequent electrodeposition steps such as acidic deposition baths and etching solutions undercut the transparent conductive layer 14 and prevent any subsequent electrodeposition of semiconductor layers thereon. The front contact current collector grid strips 16 are essentially insulated from active semiconducting regions. The overall effectiveness of the photovoltaic device is greatly diminished and ultimate failure of the device would be likely.

Figure 2:
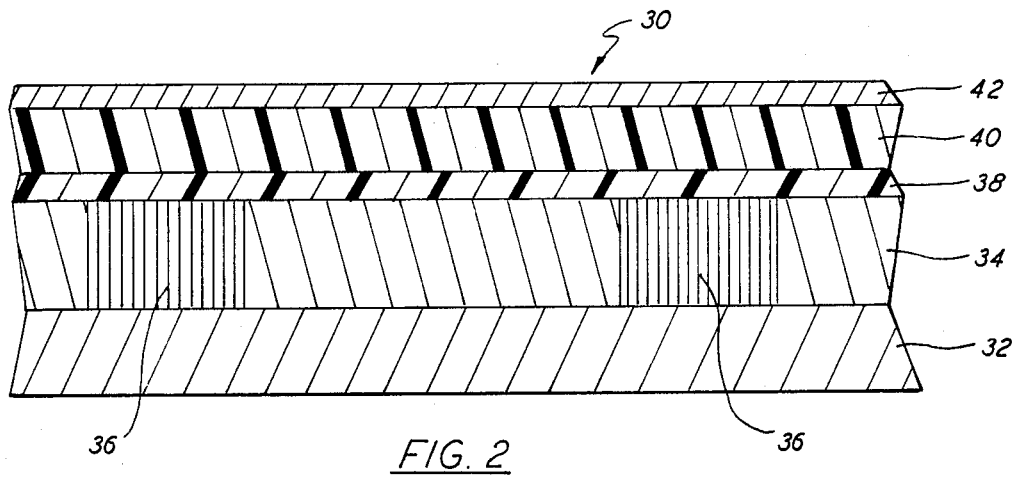
FIG. 2 is a cross-sectional view of a photovoltaic device in accordance with the present invention wherein a front contact current collector grid is fully embedded in the transparent conductive layer.

FIG. 2 shows a cross-sectional view of a photovoltaic device in a preferred embodiment of the present invention. As can be seen, the photovoltaic device generally referred to by reference number 30 comprises a transparent substrate 32 through which radiant energy enters the photovoltaic device. An optically transparent electrically conductive material 34 is deposited on the substrate 32. The transparent conductive layer 34 is then etched, scribed or otherwise conditioned so that channels are formed therein in a pattern describing the shape of the front contact current collector grid that is to be utilized in the photovoltaic device. The depth of the channel is determined by the required thickness of the grid, which is based on the electrical conductivity of the grid material and the surface area of the device over which each strip in the grid is responsible for collecting current. The channels are then filled with the current collector grid material. As shown in FIG. 2, the current collector grid 36 extends the full thickness of the transparent conductive layer 34.

Deposited onto the transparent conductive layer 34 which now contains the current collector grid 36 is a first semiconductor layer 38. Contiguous to the first semiconductor layer 38 is a second semiconductor layer 40 having a conductivity type that is different from the conductivity type of first semiconductor layer 38. A back electrical contact 42 is disposed over the second semiconductor layer 40 and in ohmic contact therewith. This configuration efficiently incorporates a front contact current collector grid into a thin-film photovoltaic device without suffering from the disadvantages of prior configurations. An electrically insulating layer is generally not necessary as the current collector grid 36 of this embodiment is sufficiently spaced apart from the back electrical contact 42.

Figure 3:
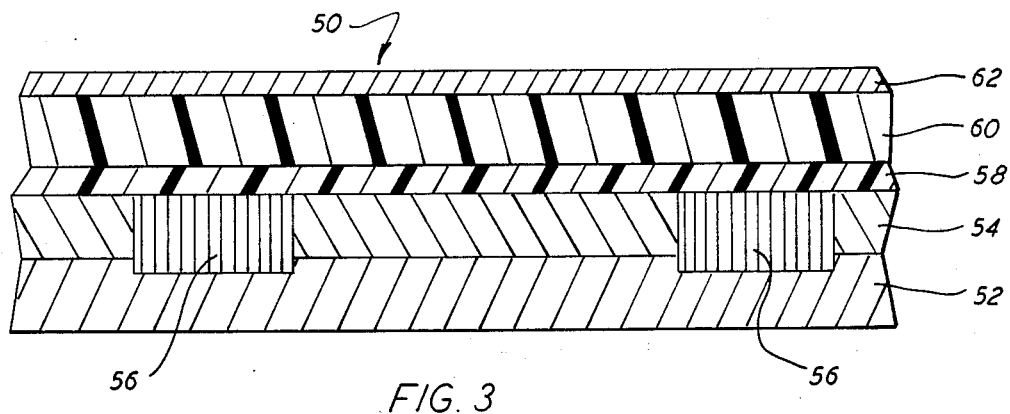
FIG. 3 is a cross-sectional view of an alternative embodiment of the subject invention wherein the front contact current collector grid is embedded in the transparent conductive layer and further extends partially into the transparent substrate.

An alternative embodiment of the subject invention is displayed in FIG. 3. In FIG. 3 there is shown a thin film photovoltaic device 50 having a substrate 52, a transparent conductive layer 54 disposed on the substrate 52, a first semiconductor layer 58, a second semiconductor layer 60, and a back electrical contact 62. A front contact current collector grid 56 is embedded in the transparent conductive layer 54, and due to its height exceeding the thickness of the transparent conductive layer 54, the grid 56 also extends partially into the substrate 52. Means for forming the channels for the current collector grid in the transparent conductive layer and the substrate may differ, but the formation of such channels can be accomplished using known etching and scribing techniques.

Figure 4:
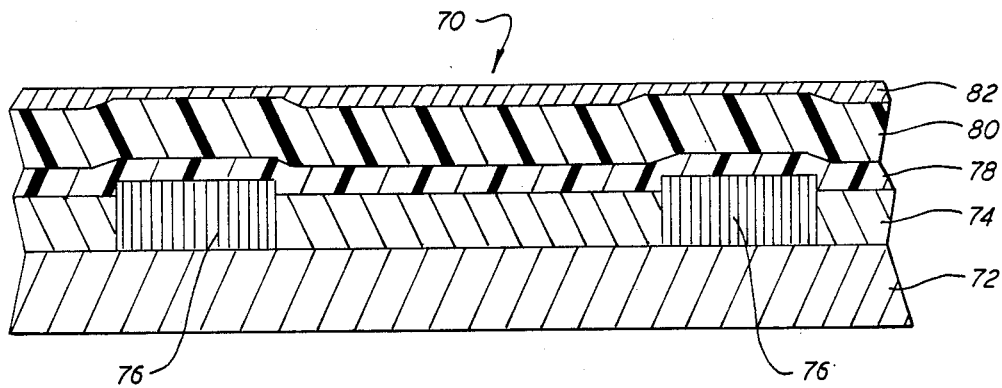
FIG. 4 is a cross-sectional view of yet another embodiment of a photovoltaic device in accordance with the subject invention wherein the front contact current collector grid is embedded in the transparent conductive layer as well as extending partially into the first semiconductor layer.

Another embodiment of the subject invention is depicted in FIG. 4 wherein the front contact current collector grid 76 does not extend into the substrate 72, but rather partially extends into the first semiconductor layer 78. FIG. 4 depicts a cross-section of a photovoltaic device 70 having a transparent substrate 72, a transparent conductive layer 74 deposited onto the substrate 72, a first semiconductor layer 78, a second semiconductor layer 80 having a different conductivity type than the first semiconductor layer 78, and a back electrical contact 82.

After formation of the transparent conductive layer 74, channels are formed in that layer that extend the full width of the transparent conductive layer 74. The front contact current collector grid 76 is then deposited therein and, in this embodiment, also extends upward beyond the thickness of the transparent conductive layer 74. That portion of the current collector grid 76 that is not in the transparent conductive layer 74 extends upward into the first semiconductor layer 78. However, since a significant portion of the grid is embedded in the transparent conductive layer 74, and a relatively small portion of the grid 76 extends beyond the transparent conductive layer 74, the previously cited disadvantages of having a current collector grid in thin-film semiconductor photovoltaic devices are avoided. The subsequent depositions of semiconductor layers 78 and 80 are not significantly affected by the existence of a portion of the current collector grid 76 extending above the transparent conductive layer 74.

Figure 5:
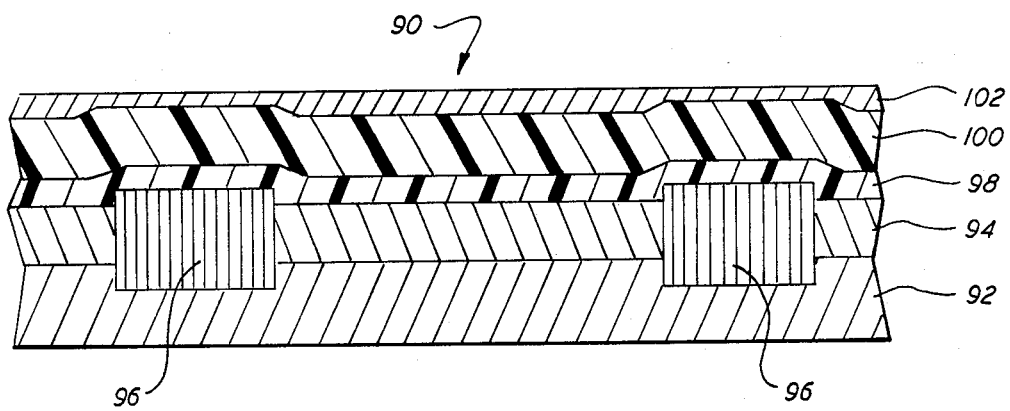
FIG. 5 is a cross-sectional view of still another embodiment of a photovoltaic device in accordance with the present invention wherein the front contact current collector grid is embedded in the transparent conductive layer as well as extending partially into the transparent substrate and partially into the first semiconductor layer.

Still another embodiment of the subject invention is shown in FIG. 5. In FIG. 5 there is depicted a thin-film photovoltaic device 90 having a substrate 92, a transparent conductive layer 94, a first semiconductor layer 98, a second semiconductor layer 100, and a back electrical contact 102. A front contact current collector grid 96, having a relatively large thickness, is shown traversing the full thickness of the transparent conductive layer 94 and extending partially into the transparent substrate 92 and partially into the first semiconductor layer 98. In this embodiment, a current collector grid having relatively poor electrical conductivity or a geometry which requires a relatively large thickness can be accommodated in a thin-film semiconductor photovoltaic device without incurring the processing concerns identified herein above.

Inasmuch as the present invention is subject to many variations, modifications and changes of detail, a number of which have been expressly stated herein, it is intended that all matter described throughout this specification or shown in the accompanying drawings be interpreted as illustrative and not in a limiting sense. It should thus be evident that a device constructed in accordance with the concepts of the present invention or a method for the making thereof, and reasonable equivalents thereto, will accomplish the objects of the present invention. The scope of the invention is intended to include all modifications and variations that fall within the scope of the attached claims.

We claim:

1. A thin-film photovoltaic device comprising a transparent substrate through which radiant energy enters the device, a layer of a transparent, electrically conductive material disposed on said substrate as a front contact, a thin film comprising two or more layers of semiconductor materials disposed on said transparent, electrically conductive layer and an electrically conductive film disposed on said thin film of semiconductor materials to form a rear electrical contact to said thin film, wherein said layer of transparent, electrically conductive material contains a plurality of openings extending from said substrate to said thin film of semiconductor materials and wherein a metal is disposed in said openings in contact with at least said transparent, electrically conductive material and said thin film of semiconductor materials to form a front contact current collecting grid.

2. The photovoltaic device of claim 1 wherein said transparent substrate is glass.

3. The photovoltaic device of claim 1 wherein said transparent, electrically conductive material is selected from the group consisting of indium tin oxide, indium oxide, zinc oxide, and tin oxide.

4. The photovoltaic device of claim 1 wherein said metal forming said front contact current collector grid is selected from the group consisting of copper, gold, silver, nickel, aluminum, cadmium, lead, zinc, and mixtures and alloys thereof.

5. The photovoltaic device of claim 1 wherein said front contact current collector grid comprises a layer of copper and a layer of nickel.

6. The photovoltaic device of claim 1 wherein said thin film of semiconductor materials comprises a layer of a compound having a metal element selected from Class IIB and at least one non-metal element selected from Class VIA of the Periodic Table of the Elements.

7. The photovoltaic device of claim 6 wherein said layer of a compound is cadmium sulfide.

8. The photovoltaic device of claim 6 wherein said layer of a compound is cadmium telluride.

9. The photovoltaic device of claim 6 wherein said layer of a compound is mercury cadmium telluride.

10. The photovoltaic device of claim 1 wherein said front contact current collector grid extends through the full thickness of said transparent, electrically conductive layer.

11. The photovoltaic device of claim 1 wherein said current collector grid has a thickness of from about 0.5 micrometers to about 10 micrometers.

12. A process for forming a photovoltaic device comprising, in sequence:
 (a) depositing a layer of a transparent, electrically conductive material onto a transparent substrate;
 (b) forming a plurality of openings in the transparent, electrically conductive layer extending to said substrate;
 (c) depositing a metal into said openings in contact with said transparent, electrically conductive material to form a current collecting grid;
 (d) depositing a thin film of semiconductor materials onto said transparent, conductive layer and in contact with said metal; and
 (e) depositing an electrically conductive film onto said thin film of semiconductor materials to provide an electrical contact therewith.

13. The process of claim 12 wherein said current collecting grid is a material selected from the group consisting of copper, gold, silver, nickel, aluminum, cadmium lead, zinc, and mixtures and alloys thereof.

14. The process of claim 12 wherein said current collecting grid comprises a layer of copper and a layer of nickel.

* * * * *